(12) United States Patent
Sharon et al.

(10) Patent No.: US 11,268,994 B2
(45) Date of Patent: Mar. 8, 2022

(54) TOPOLOGY DETECTION

(71) Applicant: S&C Electric Company, Chicago, IL (US)

(72) Inventors: Yoav Sharon, Evanston, IL (US); James Rarick, Chicago, IL (US); Amy Overmyer, Berwyn, IL (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 16/827,092

(22) Filed: Mar. 23, 2020

(65) Prior Publication Data

US 2020/0309827 A1 Oct. 1, 2020

Related U.S. Application Data

(60) Provisional application No. 62/823,114, filed on Mar. 25, 2019.

(51) Int. Cl.
*G01R 21/133* (2006.01)
*H02J 13/00* (2006.01)

(52) U.S. Cl.
CPC ...... *G01R 21/133* (2013.01); *H02J 13/00002* (2020.01)

(58) Field of Classification Search
CPC .............. G01R 21/133; G01R 19/2513; H02J 13/00002; Y04S 10/30
See application file for complete search history.

(56) References Cited

U.S. PATENT DOCUMENTS

| | | | |
|---|---|---|---|
| 8,072,999 B1* | 12/2011 | Cline | H04L 12/437 370/431 |
| 10,051,587 B2* | 8/2018 | Jayaraman | H04W 56/001 |
| 2003/0177216 A1 | 9/2003 | Sutherland et al. | |
| 2013/0024149 A1 | 1/2013 | Nayar et al. | |
| 2013/0091258 A1 | 4/2013 | Shaffer et al. | |

(Continued)

FOREIGN PATENT DOCUMENTS

CN 103150425 A 6/2013

OTHER PUBLICATIONS

Deepjyoti Deka et al.; "Structure Learning in Power Distribution Networks"; in IEEE Transactions on Control of Network Systems, pp. 1-14 (14 pages).

(Continued)

*Primary Examiner* — Manuel A Rivera Vargas

(57) ABSTRACT

A method of determining the topology of a portion of the electrical distribution grid such as a feeder based on voltage and current measurements. The method employs Bayesian-based topology detection, where voltage and current data is measured at switches in the feeder at numerous sample times. A voltage variance is calculated for each switch, along with a voltage correlation coefficient for each pair of switches. Voltage variance is used to establish a preliminary position of a switch in the feeder, where switches closest to the substation source are expected to exhibit the least variance, and vice versa. The voltage correlation coefficient is used to provide a first determination of whether two switches are in series with each other in a parent-child relationship, and a current magnitude comparison is used to confirm or refute the preliminary parent-child relationship between the two nodes.

20 Claims, 8 Drawing Sheets

(56) References Cited

U.S. PATENT DOCUMENTS

2014/0032144 A1    1/2014  Kussyk
2017/0353910 A1*  12/2017  Xhafa ................. H04W 40/248
2019/0042911 A1*   2/2019  Koren .................... G06N 3/082

OTHER PUBLICATIONS

International Search Report and Written Opinion for International Application No. PCT/US2020/024216 dated Jun. 16, 2020. (11 pages).

* cited by examiner

TOPOLOGY DETECTION

CROSS-REFERENCE TO RELATED APPLICATION

This application claims the benefit of priority from the U.S. Provisional Application No. 62/823,114, filed on Mar. 25, 2019, the disclosure of which is hereby expressly incorporated herein by reference for all purposes.

BACKGROUND

Field

The present disclosure relates generally to a method for determining switch node topology in an electrical grid. More particularly, it relates to a method for determining switch node topology for a distribution feeder via real-time voltage and current measurements.

Discussion of the Related Art

An electrical power transmission/distribution network, often referred to as an electrical grid, typically includes a number of power generation plants each including a number of power generator units, such as gas turbine engines, nuclear reactors, coal-fired generators, hydro-electric dams, etc. The grid may also include wind and/or solar energy generation installations. Not only are there many different types of energy generators on the grid, but there are also many different types of loads, and the generators and loads are distributed over large geographic areas. The transmission grid carries electricity from the power plants over long distances at high voltages. The distribution grid, separated from the transmission grid by voltage-reducing substations, provides electricity to the consumers/loads.

The distribution grid is divided into many sub-elements commonly known as feeders, which are connected to a primary source (i.e., substation) at one end, with many consumers (residences and businesses) connected along the length of the feeder. In recent years, many distribution grid feeders have implemented automated fault location, isolation and service restoration (FLISR)—which involves smart switches placed at various nodes throughout the feeder, where these switches can be commanded to automatically open in order to isolate a fault, or automatically close in order to restore power to a portion of a feeder which lost power due to a fault isolation.

In addition, there has also recently been a rapid increase in distributed generation installations such as solar generation (photovoltaic panels) and wind generation (wind turbines). Solar and wind generation are highly variable forms of electric generation—where they may provide a majority of a feeder's power needs on a sunny and windy day, and provide no power at all at other times.

In the past, electrical distribution grids were generally static (having a fixed topology) with few real-time changes in the state of the system. However, with the introduction of distributed generation along with automatic control/restoration devices and logic, an electrical grid network can become increasingly dynamic in its state and current flow. Discovering the topology in a static manner is typically performed by manual input into Geographic Information Systems (GIS). This, however, can be error-prone and is time consuming. The present state of the system can also be discovered by a supervisory control and data acquisition (SCADA) system polling to a central server. However, manual switching devices without controls cannot be discovered by SCADA systems, though they can be critical to the topology of the system.

Knowing feeder topology is important to grid operators in order for the operators to properly manage power flow, ongoing topology changes, repair of faults, and other activities occurring on the network.

In view of the circumstances described above, there is a need for a method of determining feeder topology in real time based on voltage and current data measured at the switches, which does not rely on manual GIS input and which reflects topology changes due to switch actuations.

SUMMARY

The present disclosure describes a method of determining the topology of a portion of the electrical distribution grid such as a feeder. The method employs Bayesian-based topology detection, where voltage and current data is measured at switches in the feeder at numerous sample times. A voltage variance is calculated for each switch, along with a voltage correlation coefficient for each pair of switches. Voltage variance comparisons are used to establish a preliminary parent-child relationship for two switches in the feeder, where switches closest to the substation source are expected to exhibit the least variance. The voltage correlation coefficient is used to provide a first determination of whether two switches are in series with each other, and a current magnitude comparison is used to confirm or refute the preliminary parent-child relationship between the two nodes.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a technique for determining a topology of a feeder in the electrical distribution grid is merely exemplary in nature and is in no way intended to limit the disclosure or its applications or uses.

An electrical power grid consists of a transmission network and a distribution network. The transmission network handles the movement of electrical energy from a generating site, such as a power plant, to a voltage-reducing substation. The distribution network moves electrical energy on local wiring between substations and customers. The distribution portion of the grid is divided into feeders which provide power to many customers, both residential and commercial. Small to medium-size distributed generation installations (solar and/or wind) may also exist on some feeders. Feeders also include automated switches which can open or close to respond to faults, as well as manual switches, creating the possibility of changing topology of the feeders.

Figure 1:
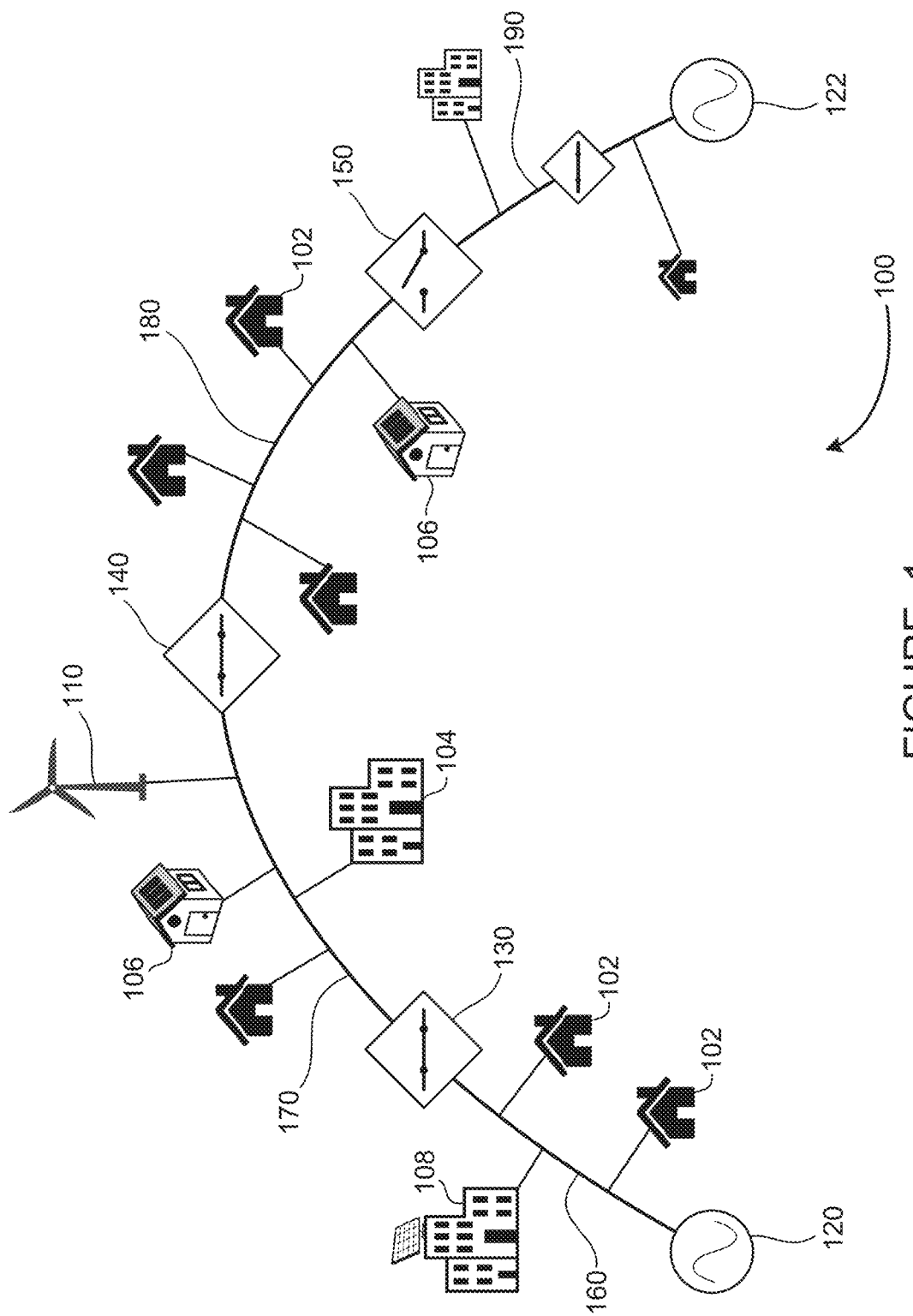
FIG. 1 is a schematic diagram of a typical feeder, or portion of the distribution grid, with distributed generation at some locations, as known in the art.

FIG. 1 is a schematic diagram of a typical feeder 100, or portion of the distribution grid, as known in the art. The feeder 100 provides electrical energy to many end customers, including houses 102 and businesses 104. The feeder 100 has a main source 120 at one end and an alternative source 122 at the other end. The sources 120 and 122 are typically substations, where high voltage energy (often several hundred thousand volts) on the transmission grid is transformed down to medium voltage energy (less than 30,000 volts), where it is carried on local power lines and further down-transformed for distribution to the customers. The main source 120 is normally connected to and provides the power to the feeder 100, while the alternative source 122 is part of a different feeder and is normally disconnected from the feeder 100 by an open tie switch 150.

Between the main source 120 and the alternative source 122, switches 130, 140 and 150 divide the feeder 100 into sections. A section 160 is located between the main source 110 and the switch 130, a section 170 is located between the switch 130 and the switch 140, and a section 180 is located between the switch 140 and the switch 150. The switches 130 and 140 are normally closed, so that the main source 120 provides power to the sections 160, 170 and 180 of the feeder 100. The tie switch 150 is normally open, with a section 190 between the alternative source 122 and the switch 150. The section 190, with its own customers and switches, is a different feeder than the feeder 100, and is shown simply to illustrate that topologies can change dramatically—such as when the open tie switch 150 is closed to restore power to a part of the feeder 100 after a fault is isolated.

It is to be understood that the feeder 100 is a three-phase network. That is, each of the sections 160, 170 and 180 includes three lines ($L_1, L_2, L_3$), each 120° out of phase with the others. The houses 102 and the businesses 104 may receive service from one or more of the phases, where the houses 102 almost always have single-phase service, and the businesses 104 may have three-phase service if they have high energy demands and/or large inductive loads such as motors.

Some of the customers on the feeder 100 have installed local solar generation capability, typically a photovoltaic (PV) panel or a small array of PV panels. On the feeder 100, houses 106 and a business 108 are shown having solar panels. As discussed earlier, the solar panels at the houses 106 and the business 108 may be capable of providing most of all of the electrical power needed by the home or business at some times, and may even provide excess power back to the distribution grid under some circumstances. For example, on a sunny weekday when most of the residents are not at home, the houses 106 may generate several kilowatts (kW) of surplus power which is available to go back onto the grid. Likewise for the business 108 on a sunny weekend day when the business 108 is closed. On the other hand, the houses 106 and the business 108 may have to buy all of their electrical energy from the utilities in other circumstances (i.e., when the sun is not shining).

Similarly, the feeder 100 may include one or more wind turbines 110. The wind turbines 110 exhibit the same variability in power production discussed above for the solar installations. It is to be understood that the feeder 100 and the feeders discussed below in relation to the disclosed techniques may include any combination of customer loads/types, distributed generation at customer sites, distributed generation at dedicated facilities, etc.

Understanding distribution network topology and the direction and magnitude of power movement are critical to grid operators' ability to manage and operate a reliable grid. Historically, feeder topology was defined by manually entering data about power lines, switches and customer connections into a Geographic Information System (GIS) database. However, this type of manual, static topology definition cannot keep track of an electrical grid network which has become increasingly dynamic in its state and current flow due to the introduction of distributed generation along with automatic control/restoration devices and logic.

The present disclosure provides a technique for automatically determining topology in a portion of the distribution grid, using locally available measurements. The technique eliminates the need for manual data input for each individual switch device, and inherently reflects changes due to FLISR-initiated switch openings/closings and/or manual switch reconfiguration by linemen. This scheme provides grid operators with a current, reliable topology definition, which can be used to coordinate traditional and distributed power generation, and to improve fault location, isolation and service restoration.

In the disclosed method, a Bayesian-based topology identification technique is used. A Bayesian network, or Bayesian model, is a probabilistic graphical model (a type of statistical model) that represents a set of variables and their conditional dependencies via a directed acyclic graph (DAG). Using Bayesian techniques, the connectivity (topology) of a set of nodes (line sections) and edges (feeder switches) can be determined based on measurements made at the nodes and their relationships with each other.

It will be shown in the following discussion of FIGS. 2-8 that a combination of voltage variance and current amplitude statistics, taken from a set of measurement samples, can be analyzed to recursively identify parent-child relationships, ultimately leading to a complete and accurate network topology definition, while other techniques which do not analyze both voltage and current data in the prescribed manner can produce erroneous topology results.

Figure 2:
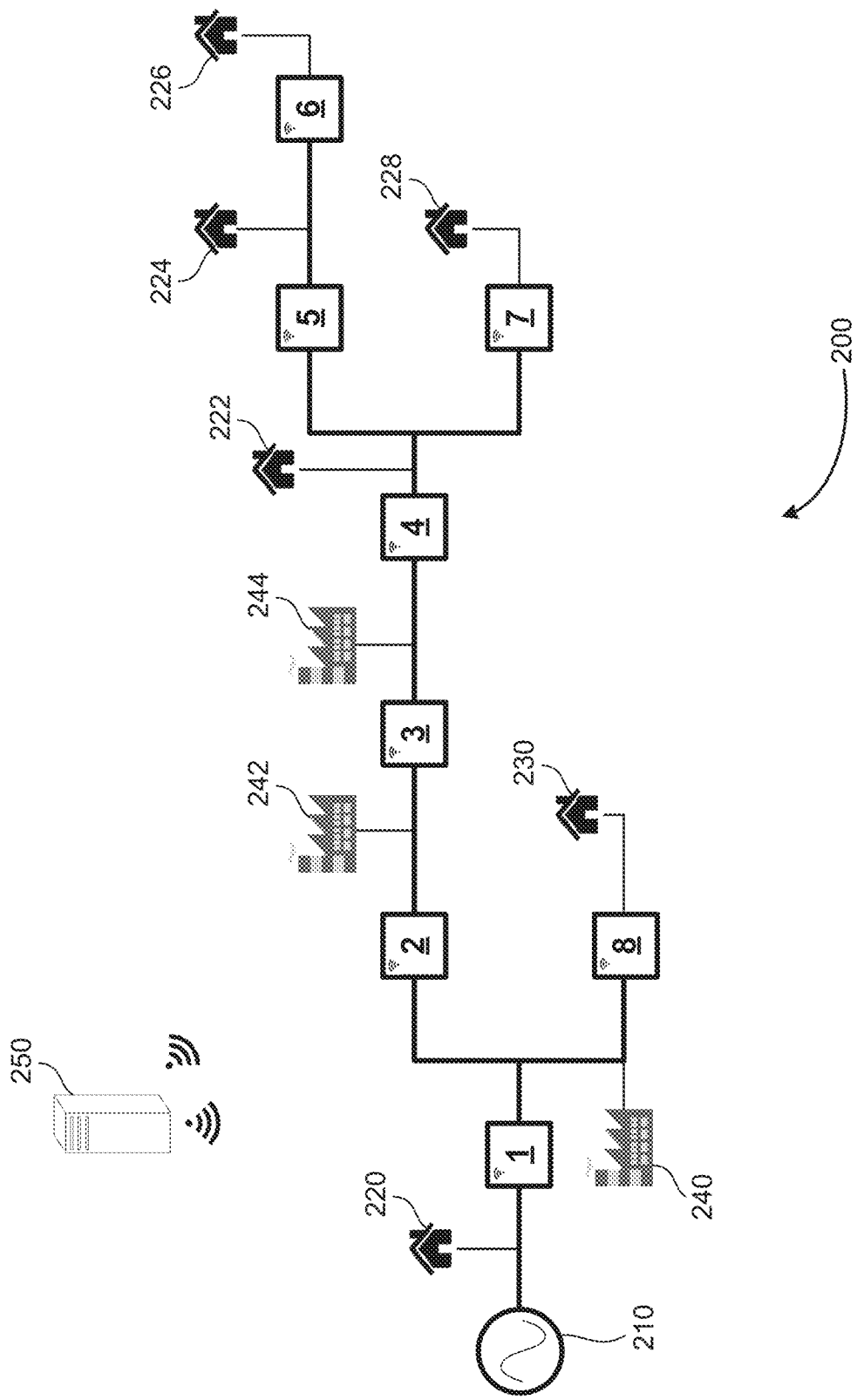
FIG. 2 is a schematic diagram of a feeder, or portion of the distribution grid, used for discussion of topology detection techniques according to an embodiment of the present disclosure.

FIG. 2 is a schematic diagram of a feeder 200, or portion of the distribution grid, used for discussion of topology detection techniques according to an embodiment of the present disclosure. A real-world feeder has features not shown in FIG. 2—such as "laterals", or side branches serving a group of customers, with no alternate source. However, the feeder 200 of FIG. 2 includes many exemplary topology characteristics—such as a mix of residential and industrial customers (loads), switches and branches in the network. The feeder 200 and the topology shown in FIG. 2 will be used repeatedly in the following discussion to illustrate how some topology detection techniques fail to correctly determine the network topology, and how the topology detection techniques of the present disclosure do correctly determine the network topology.

The feeder 200 includes a source 210 and a plurality of switch devices 1-8 arranged in a branched network structure. The switches 1-8 are normally-closed, so that all of the customers shown on FIG. 2 receive power from the source 210 (which is typically a substation connecting the feeder 200 to the transmission grid). Residences 220-230 represent typical homes which consume a fairly light electrical load. The residences 220-230, depicted as houses on FIG. 2 and other figures, may actually be thought of as the laterals mentioned above, which may serve an entire subdivision consisting of dozens or hundreds of homes, not just a single house. Factories 240-244 represent any sort of industrial customer which consumes a heavy electrical load—which could include anything from HVAC equipment to welders, pumps, industrial motors of all sorts, equipment processing furnaces, etc. Of course, many more homes, factories and other businesses than shown on FIG. 2 would typically be served by a feeder such as the feeder 200.

As mentioned earlier in the discussion of FIG. 1, there would typically be other adjacent feeders networked together with the feeder 200, such as a feeder downstream of the switch 7 which is separated from the feeder 200 by an open tie switch. These adjacent interconnected feeders are not shown in FIG. 2 and subsequent figures for the same of simplicity, but it is important to remember that topology can change rapidly when FLISR techniques are employed to isolate a fault and close a tie switch for power restoration. The possibility of rapidly changing topology due to FLISR, the manual opening/closing of switches by linemen, and the possible mismatch of GIS data with actual device locations are all motivations for the accurate and automatic topology detection techniques of the present disclosure.

Throughout this discussion, it should be understood that each of the switch devices 1-8 includes voltage and current measurement sensors, and a controller or processor which receives the measurements from the sensors. An actuator capable of opening or closing the switch (for all three phases) upon command from the controller may also be included in some of the switch devices 1-8, but is not required for the disclosed topology detection method. Each of the switch devices also includes a communication module capable of communicating with a computer 250. The computer 250 performs the topology calculations discussed below based on voltage and current data received from the switches 1-8. The computer 250 is shown at a separate location, but it may be located at the source 210, onboard one of the switches 1-8, or at a grid operations control center. The communication between the switches 1-8 and the computer 250 is shown as wireless, but may also be via hard-wired networks, using any communication technology.

Figure 3:
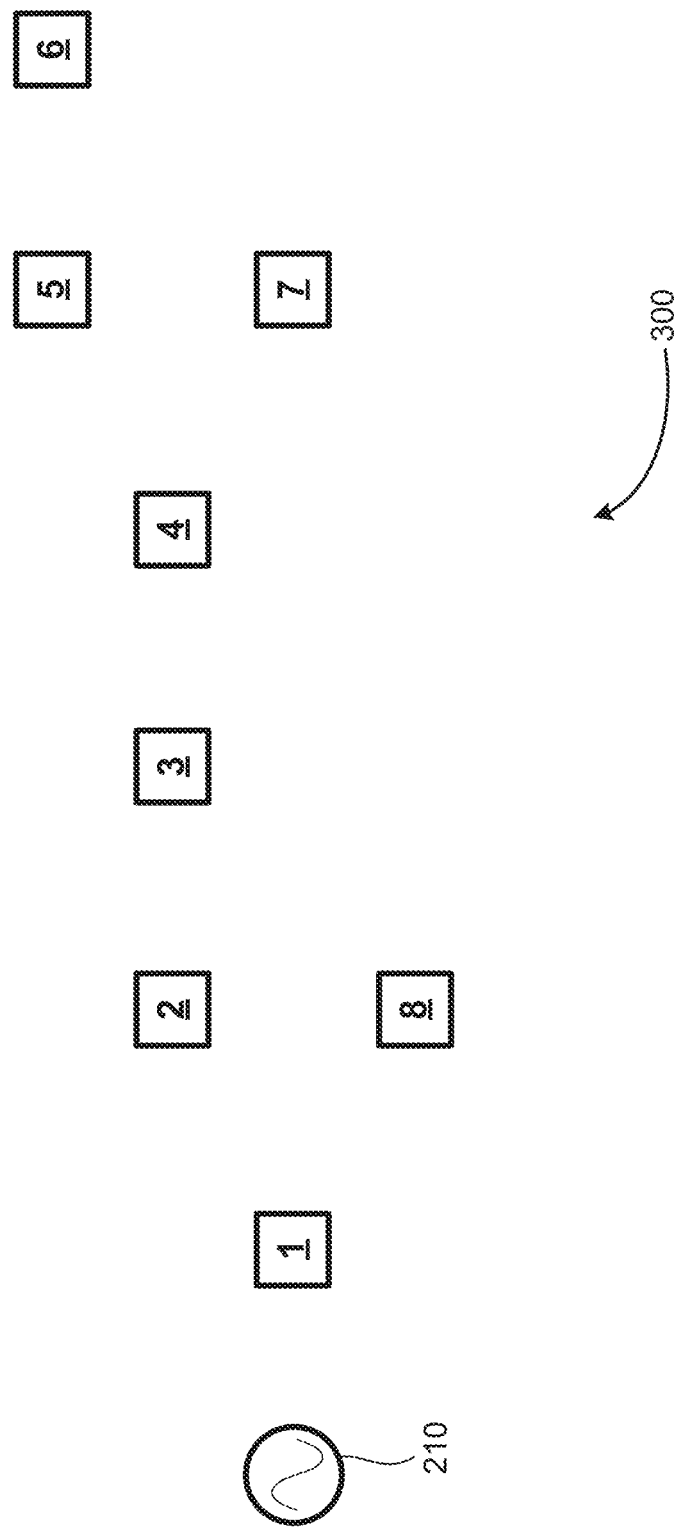
FIG. 3 is a schematic diagram of the devices in the feeder of FIG. 2 showing the initial conditions known in the topology detection techniques discussed herein.

FIG. 3 is a schematic diagram 300 of the devices in the feeder 200 showing the initial conditions known in the topology detection techniques discussed below. When a portion of the distribution grid such as the feeder 200 is constructed, the source 210 and the switches 1-8 each have a physical location which is recorded in GIS. The location of each device may be recorded as a latitude/longitude pair, measured using conventional surveying techniques, or Global Positioning System (GPS) measurement. FIG. 3 shows the locations of the source 210 and the switches 1-8 as they would appear on a map, but with no connectivity.

Although the physical locations of the source 210 and the switches 1-8 are known, their connectivity and the resulting network topology is not known. There are many different possible ways in which the source 210 and the switches 1-8 could be connected—including possibilities without branching, and many more possibilities with branching. Determining the actual connectivity (topology), using measurements made at the nodes, is the objective of the disclosed techniques. This determination begins with the schematic diagram 300 of the devices, with no known connectivity.

One approach which could be used to determine network topology from measurements at the nodes would be to analyze variations in measured current. The hypothesis here is that, over a statistical sample of many measurements, variations in current should correlate closely between a child node and its parent node, whereas current in switches in two different branches of the feeder would not be expected to correlate closely. In order to perform this analysis, a number of current measurements are taken at each node. In one non-limiting embodiment, the number of samples is 20 measurements, taken over the course of many hours or a few days. The number of samples and the time window over which they are taken may vary widely from those just mentioned, as needed.

In order to perform this current-based analysis, a correlation coefficient is calculated for each possible pair of nodes (node 1 current data compared to node 2 current data; node 1 to node 3; node 1 to node 4; . . . and so forth through node 7 to node 8). The correlation coefficient used in this analysis is defined as the covariance of the two variables divided by the product of their standard deviations. That is, for a set of 20 current measurements for each of the nodes 1-8, a correlation coefficient M can be computed for each possible combination of nodes as follows:

$$M(I_x, I_y) = \left(\frac{\operatorname{cov}(I_x, I_y)}{\sigma_x \sigma_y}\right) \quad (1)$$

Where $M(I_x, I_y)$ is the correlation coefficient between the set of current measurements $I_x$ at node x and the set of current measurements $I_y$ at node y, $\operatorname{cov}(I_x, I_y)$ is the covariance between the sets of current measurements $I_x$ and $I_y$ calculated in a typical manner (where a positive covariance means that greater values of one variable mainly correspond with the greater values of the other variable), and σ is the standard deviation of the set of 20 current measurements for each node.

Figure 4:
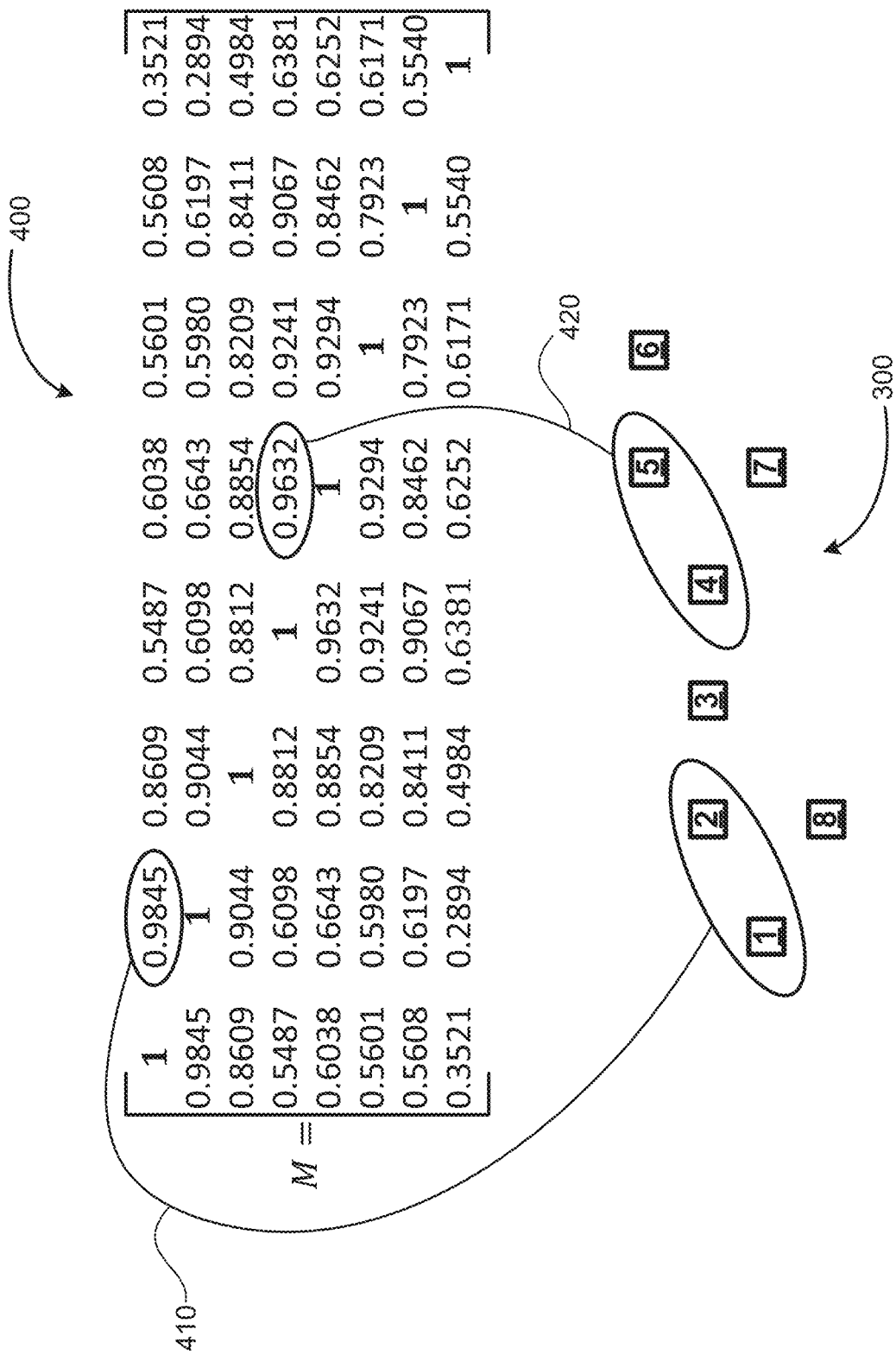
FIG. 4 is a correlation matrix depicting the correlation between current values for each pair of nodes in the feeder of FIG. 2.

FIG. 4 is a correlation matrix 400 depicting the correlation between current values for each pair of nodes in the feeder 200. The correlation matrix 400 is the result of analysis of a representative set of current measurements, with 20 measurement samples for each node, where the values in the matrix 400 are computed using Equation (1). It can be seen that the correlation matrix 400 is symmetric, with values of one on the diagonal, and symmetric values above and below the diagonal.

The hypothesis described above states that variations in current should correlate closely between a child node and its parent node. Further, when a closely correlated pair of nodes is found, the parent node can be distinguished from the child node based on current magnitude—where the parent will have higher average current than the child because it is farther upstream in the topology (in contrast, a "leaf" node will see only the current drawn by the customer loads downstream). This can be codified as follows;

While more than one device has no parent
    Find the highest correlated pair of nodes
        Use the current average to determine parent from child
        If the child is parentless Assign the parent to the child
    Else
        Set correlation value for the pair to zero
    Endwhile Using the above logic, the analysis of the correlation matrix 400 proceeds as follows. The schematic diagram 300 of the devices in the feeder 200 is included on FIG. 4 to facilitate this discussion. First, all nodes are initially defined as parentless, because no connectivity is known when the analysis begins. The highest correlated pair of nodes can be seen as having a value of 0.9845, where this value is located in row 1, column 2 of the matrix 400. Thus, this value represents the correlation between nodes 1 and 2 (row 1, column 2), as indicated by reference 410. Analysis of average current data (not shown) indicates that node 1 has a higher average current than node 2. Node 1 is therefore established as the parent of node 2.

The next highest correlated pair of nodes can be seen as having a value of 0.9632, where this value is located in row 4, column 5 of the matrix. Thus, this value represents the correlation between nodes 4 and 5, as indicated by reference 420. Analysis of the average current data indicates that node 4 has a higher average current than node 5. Node 4 is therefore established as the parent of node 5.

Continuing with this current-based analysis process, the next highest value of 0.9294 in position (5, 6) establishes node 5 as the parent of node 6. Next, the value of 0.9241 is encountered in position (4, 6), where node 4 has higher average current than node 6. However, node 6 is not parentless—it has already been established as a child of node 5. Therefore, based on the programming logic described above, node 4 is not established as the parent of node 6, and the correlation between nodes 4 and 6 is set to zero.

So far, this current-based analysis process has yielded accurate topology results. However, when the process is followed recursively all the way to completion, the technique eventually breaks down.

Figure 5:
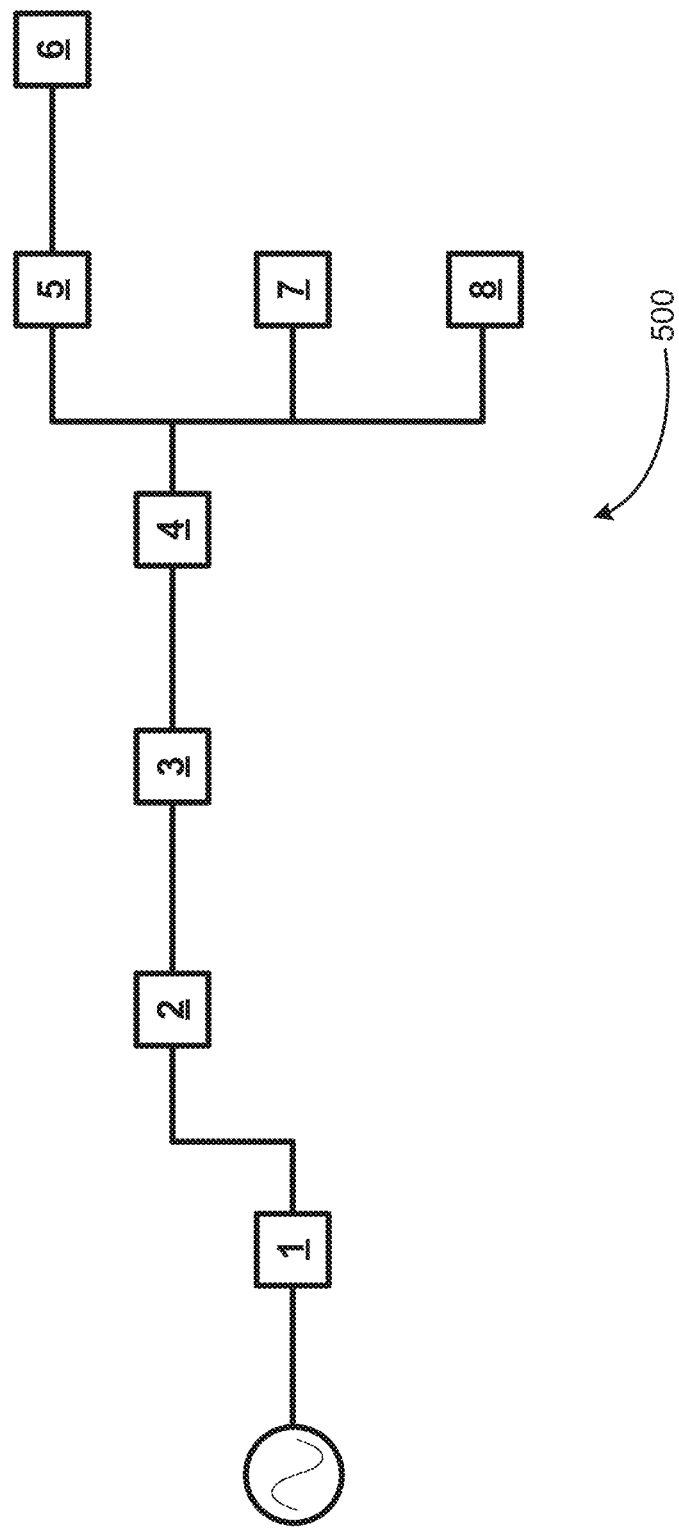
FIG. 5 is a schematic diagram of a topology as determined by a current correlation analysis approach.

FIG. 5 is a schematic diagram of a topology 500 as determined by the current correlation analysis approach described above. It can be seen that the topology 500 places switch 8 in the wrong location when compared to the actual feeder topology shown on FIG. 2. Specifically, in the topology 500, the switch 8 is designated as a child of the switch 4. This can be understood by looking at the correlation values for the switch 8 (column 8 of the matrix 400), and determining that the switch 8 has the highest correlation with the switch 4 (row 4). This is because the current at the switch 1 is being affected by all of the loads on the upper branch of the feeder 200, along with the factory 240, while the current at the switch 8 is quite small and is being affected only by the house 230. Therefore, variations in the current at the switch 8 do not correlate at all well with variations in the current at the switch 1, and the switch 8 just happens to correlate most closely with the switch 4, which also services the residence 222 (which may actually be a lateral serving an entire subdivision), thus resulting in the wrong topology.

The discussion of FIGS. 4 and 5 above lead to the conclusion that, in some circumstances, a topology analysis based on current correlation yields inaccurate topology results. A different approach is therefore needed.

In a technical paper titled "Structure Learning in Power Distribution Networks", by D. Deka, S. Backhaus and M. Chertkov, IEEE Transactions on Control of Network Systems, 2325-5870 © 2016, the authors propose a voltage-based approach to topology learning. The hypothesis underlying this voltage-based approach is that voltages nearest a source have the least variance (because the source itself provides a very stable voltage), while voltages farthest from a source have the highest variance. This voltage-based approach relies on calculation of variances across a set of voltage measurement samples for each node, and again uses correlations between the data for pairs of nodes.

In the topology discovery method based on voltage variance discussed below, a set of voltage samples are measured at each node. The sample set may include 20 measurement samples, as used in the current-based topology discovery process described earlier. A variance for the voltage samples for each node is calculated in a known manner, where the variance is the square of the standard deviation, and is computed based on the square of the difference between each sample and the mean of the samples. In addition, a correlation coefficient is computed for the voltage data for each pair of nodes, where the correlation coefficient may be computed in the same manner as shown in Equation (1) (substituting voltage measurements for current measurements), or any other suitable manner.

The topology discovery method based on voltage variance, as described in the above-referenced IEEE paper, includes the following steps;
    Define all nodes as undiscovered
    Calculate voltage variance at each node
    Assign undiscovered node with highest variance ("node a") as leaf with no parents
    Determine node with next highest variance ("node b")
    Calculate if two selected nodes have smallest covariance deviation (highest correlation coefficient) among all nodes
        If so, declare node b is parent of node a
        If not, do not connect nodes a and b
    Iterate until all nodes are discovered and no nodes are parentless At a fundamental, first principles level, it would be expected that the topology discovery technique based on voltage variance would cure the problem observed with the current correlation technique. That is, the current correlation technique (recall FIG. 5) erroneously placed the switch 8 on a branch at the far end of the feeder from the source. The voltage variance technique, however, should place the switch 8 near the switch 1 because the switch 8 will have a low voltage variance due to its proximity to the source 210. When the voltage variance method described above is applied to the voltage sample data, it can be seen that switch 8 has switch 1 as its parent as it should, but other inaccuracies have been introduced.

Figure 6:
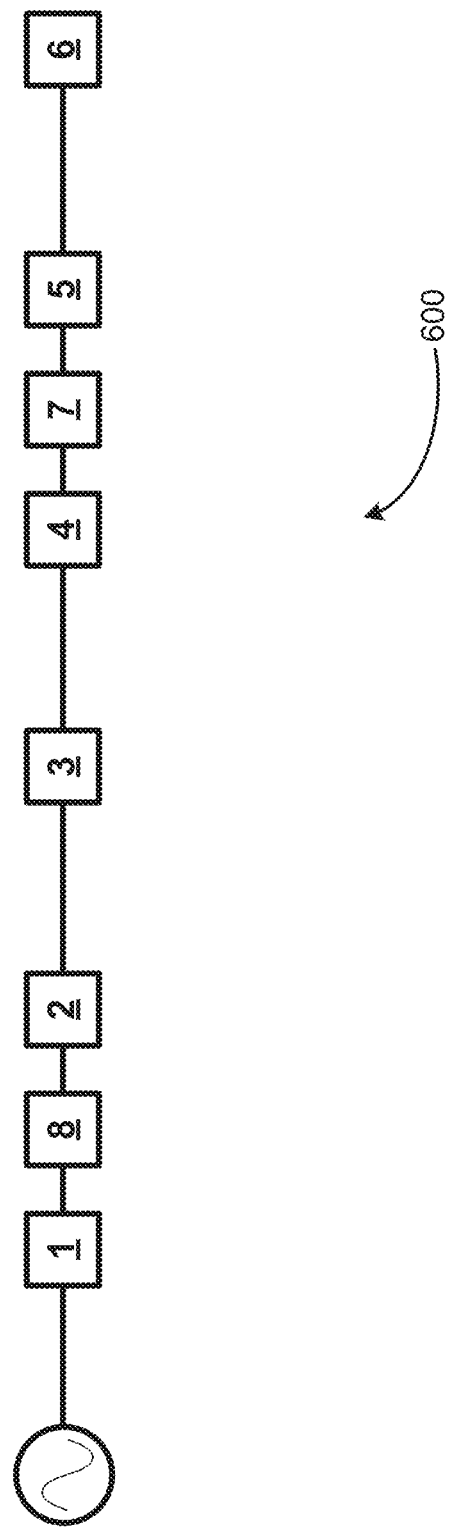
FIG. 6 is a schematic diagram of a topology as determined by a voltage variation analysis approach.

FIG. 6 is a schematic diagram of a topology 600 as determined by the voltage variation analysis approach described above. It can be seen that the topology 600 has placed the switches 1-6 in the correct order, but has erroneously inserted switch 8 between switches 1 and 2, and erroneously inserted switch 7 between switches 4 and 5. It can also be seen that the topology 600 is a simple straight line with no branches. Thus, although the topology 600 as determined by the voltage variation analysis approach placed each switch in generally correct proximity to the source 210, the resulting topology is still incorrect.

Part of the problem with the topology discovery technique based on voltage variation is that the technique cannot reliably find branch points in the network unless there is a measurement node located at the branch point. In real-world distribution networks, this is often not the case. Although there is usually a utility pole located at branch points, there is often not a switch (serving as a measurement node) at the branch point, as switch placement is based on a variety of other factors. Thus, as shown in the feeder 200 of FIG. 2, branch points are not co-located with switches, and customer loads (such as the factory 240 and the residence/lateral 222) can be located between a branch point and its nearest switch. These factors contribute to the problems with the voltage variation topology discovery technique reflected in FIG. 6.

FIG. 5 showed that a topology analysis based on current correlation yields inaccurate topology results where a lightly-loaded switch on a branch near the source does not correlate well with its parent switch. FIG. 6 showed that a topology analysis based on voltage variance yields inaccurate topology results where branch points are not reliably detected if not co-located with a measurement node. A different approach is therefore needed. It has been determined that a topology detection technique which analyzes both voltage and current measurement data, in a particular manner, provides the correct network topology. This technique is discussed below, according to embodiments of the present disclosure.

Figure 7:
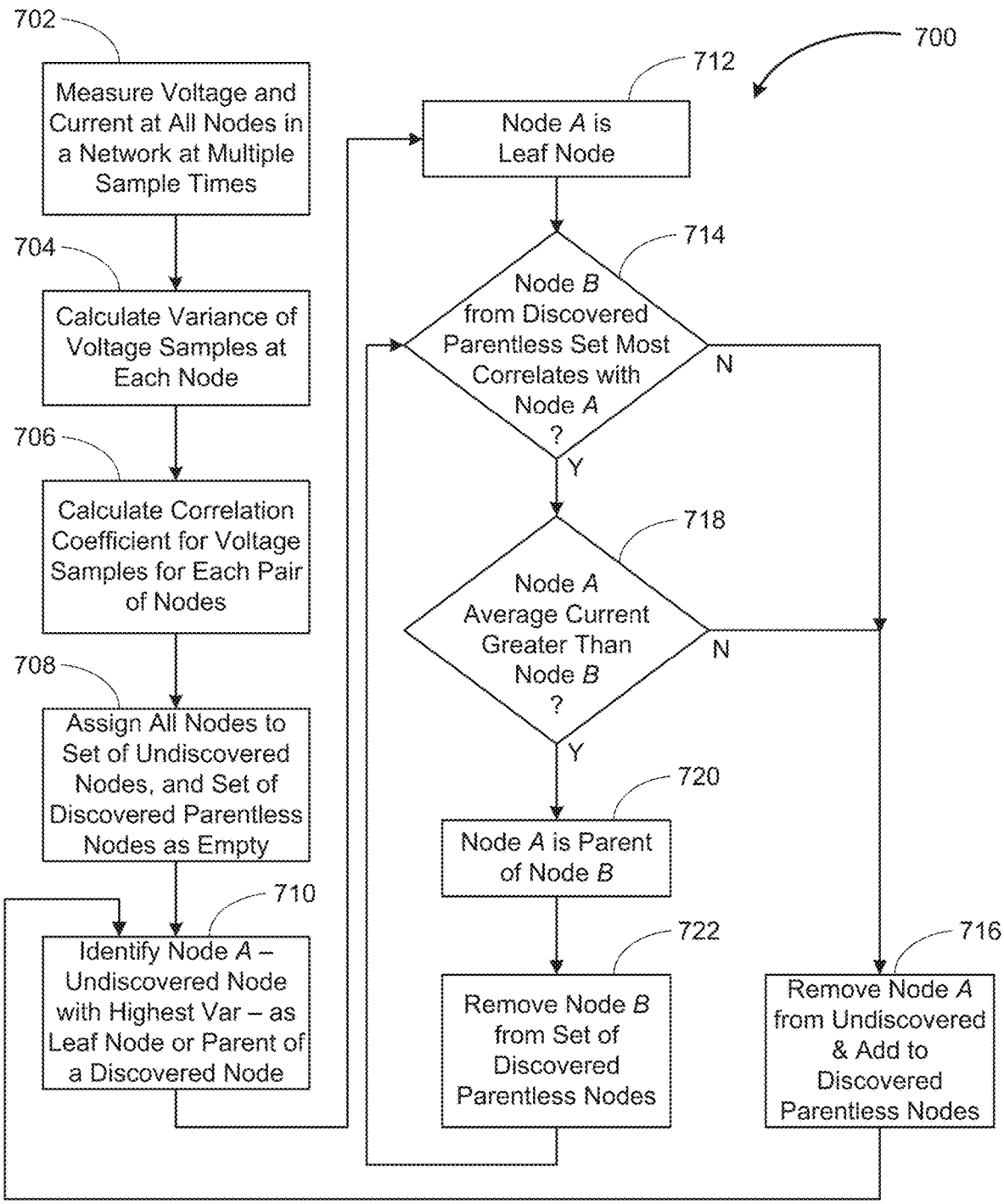
FIG. 7 is a flowchart diagram of a method for detecting network topology, using both measured voltage and current data, according to an embodiment of the present disclosure.
Figure 8:
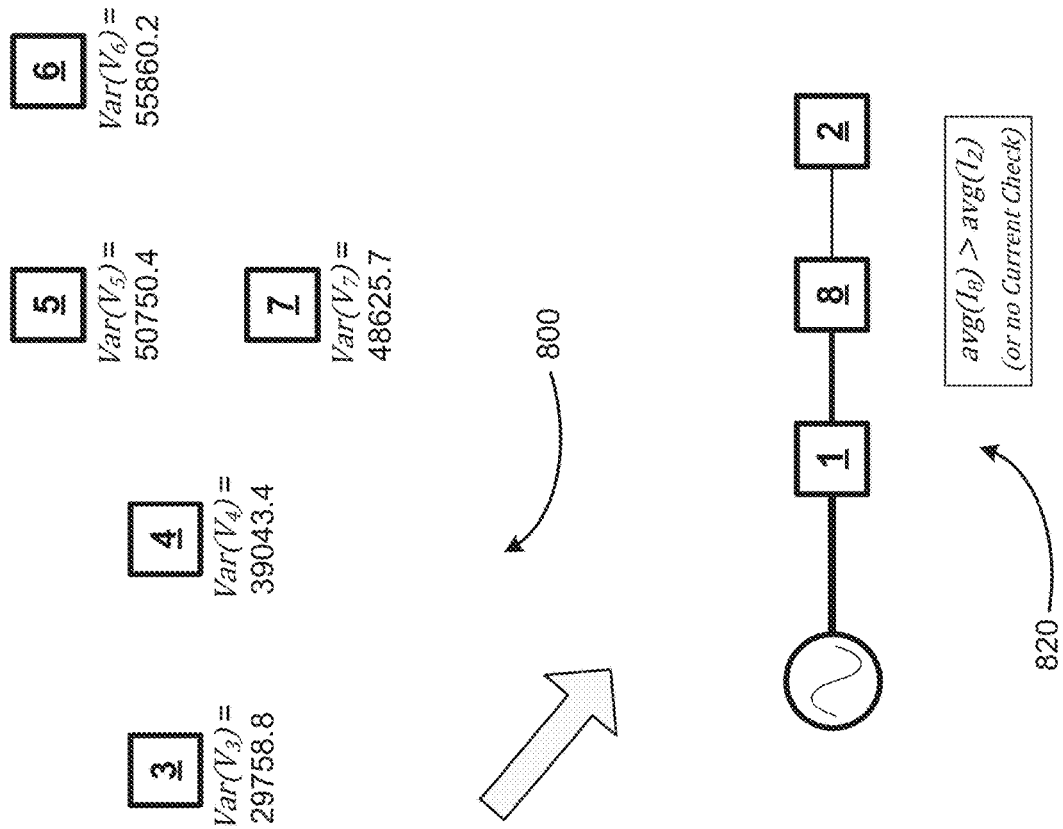
FIG. 8 is a schematic diagram of the devices in the feeder of FIG. 2 with voltage variance data, and one part of the topology detection results, according to an embodiment of the present disclosure.
Figure 8:
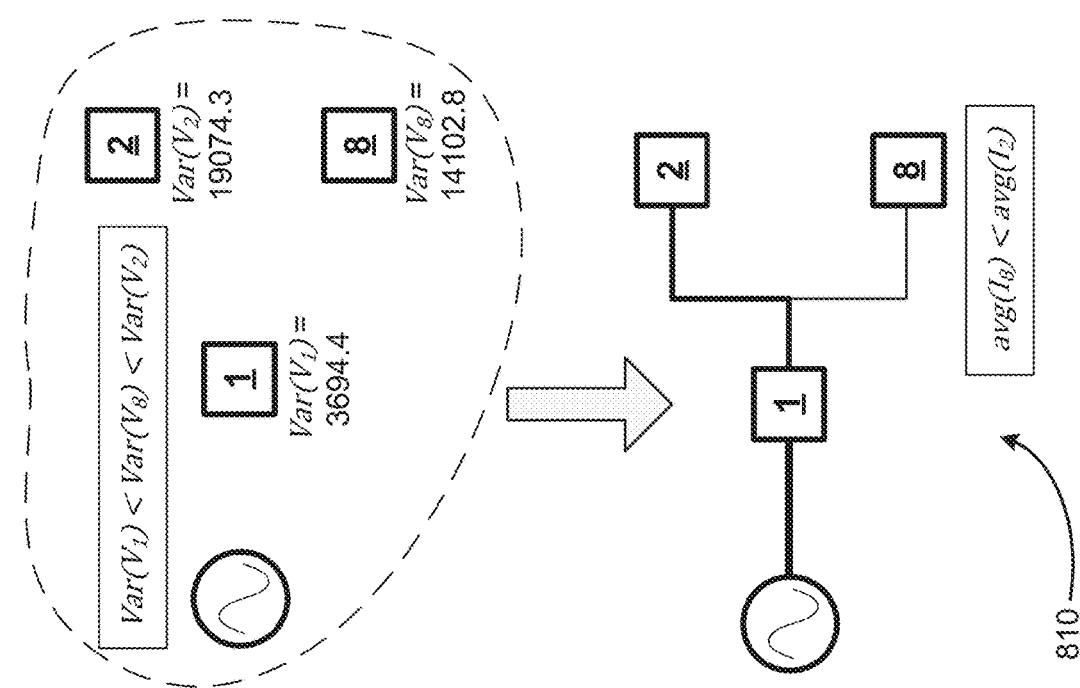

FIG. 7 is a flowchart diagram 700 of a method for detecting network topology, using both measured voltage and current data, according to an embodiment of the present disclosure. FIG. 8 is a schematic diagram 800 of the devices in the feeder 200 with voltage variance data, and one part of the topology detection results, according to an embodiment of the present disclosure. The method according to the present disclosure shown on FIG. 7 includes steps from the voltage variance technique described above, with additional steps and calculations using current data to improve the resulting topology accuracy. FIG. 8 will be discussed concurrently with the method steps of FIG. 7 in order to illustrate how the method works and how the additional steps and calculations improve the results compared to the techniques discussed previously.

At box 702, voltage and current data is measured at all nodes (switches) in the feeder network at multiple sample times. In the case of the example feeder 200, there are eight switches, where each of the switches 1-8 is capable of opening the circuit on all three phases to isolate a fault, measuring voltage and current data, and communicating with other switches and a common computer, as discussed previously. The measurement data in the non-limiting example includes 20 sample times spread out over a period of several hours or a few days. More or less than 20 measurement samples may be used. The voltage and current measurement data is provided to a computer, such as the computer 250 of FIG. 2, via any hard-wired or wireless communication channel.

At box 704, the variance of the 20 voltage samples for each node is calculated using standard statistical techniques, where the variance is the square of the standard deviation. FIG. 8 shows the voltage variance for each of the eight switches, calculated from sample data for the feeder 200, on phase 1 (or A). Any phase can of course be used. The variances shown were calculated by the computer 250 from the voltage magnitude for the 20 data points for each switch.

At box 706, the correlation coefficient of the voltage data for each pair of nodes/switches (1:2, 1:3, . . . 7:8) is calculated based on the same 20 measured data points for each switch. The correlation coefficient may be calculated using Equation (1) (using voltage data rather than current data), or any other suitable statistical technique. The correlation coefficient may be calculated based on the voltage magnitude or the phase angle, as both parameters will exhibit similar correlation behavior based on network connectivity.

At box 708, the recursive topology discovery calculation is initialized by assigning all nodes to the set of undiscovered nodes, and defining a set of discovered parentless nodes as initially empty. This recursive topology discovery calculation—discussed through the remainder of the flowchart diagram 700—is performed on the computer 250.

At box 710, the node from the set of undiscovered nodes with the highest variance is identified as node A. Based on the theory that nodes farthest from the source will exhibit the highest variance, node A is either a leaf node or the parent of an already discovered node. At box 712, node A is defined as a leaf node, although this designation could change later in the process.

In the first pass through the calculations, node A will be a leaf node, because there are no previously discovered nodes. Looking at the variance data on FIG. 8, it can be seen that node A for the first pass through the calculations will be node/switch 6, which has the highest variance. In subsequent passes through the calculations, nodes with lower variance than switch 6 will be encountered, and will be identified either as a new leaf or the parent of an identified node, moving to the left on FIG. 8.

At decision diamond 714, it is determined whether there exists a node B from the set of discovered parentless nodes which most closely correlates with node A—that is, the correlation coefficient between node B and node A is greater than the correlation coefficient between node B and any of the undiscovered nodes. In the first pass through the calculations, there is no node B because there are no discovered parentless nodes. Thus, from the decision diamond 714, the answer is no, and node A (switch 6) is removed from the set of undiscovered nodes and added to the set of discovered parentless nodes at box 716. From the box 716, the process loops back to the box 710 to identify the next node A from the set of undiscovered nodes.

In the second pass through the calculations, at the box 710, the undiscovered node with the highest variance will be identified as switch 5, which becomes node A, and is temporarily identified as a leaf node at the box 712. At the decision diamond 714, there is a discovered parentless node, which is switch 6 from the first pass. Switch 6 will have a high correlation coefficient with switch 5, because they are on the same branch. Switch 6 thus becomes node B for this pass, and the answer is yes at the decision diamond 714. At decision diamond 718, it is determined whether node A (switch 5) has a higher average current than node B (switch 6). This calculation is based on the measured current for the 20 data samples for each node. It can be seen on FIG. 2 that switch 5 carries all of the current of switch 6 plus current for customers located between switch 5 and 6 (such as the house 224). Thus, switch 5 does have a higher average current than switch 6, and the answer is yes at the decision diamond 718.

At box 720, node A (switch 5) is identified as the parent of node B (switch 6), which is a correct topology determination for the feeder 200. At box 722, node B (switch 6) is removed from the set of discovered parentless nodes. From the box 722, the process loops back to the decision diamond 714 to determine whether there is another discovered parentless node which might also be the child of node A.

In this pass through the calculations, there are no more discovered parentless nodes, so the answer is no at the decision diamond 714, and at the box 716 node A (switch 5) is removed from the set of undiscovered nodes and added to the set of discovered parentless nodes. Thus far in the iterative calculation, switch 6 is identified as a leaf node, and switch 5 is identified as the parent of switch 6.

In the next pass through the process, switch 7 will be found at the box 710 to have the next highest variance from the undiscovered set and will be identified as node A. However, the correlation coefficient between switch 5 and switch 4 will be higher than the correlation coefficient between switch 5 and switch 7, so at the decision diamond 714 the answer will be no, so switch 7 (node A) will remain designated as a leaf node and at the box 716 switch 7 will be removed from the set of undiscovered nodes and added to the set of discovered parentless nodes. At this point in the iterative process, switch 5 is the parent of switch 6, and switches 5 and 7 are parentless.

In the next pass through the process, switch 4 will be found at the box 710 to have the next highest variance and will be identified as node A. The correlation coefficient between switch 4 and switch 5 will likely be higher than the correlation coefficient between switch 4 and switch 7, so at the decision diamond 714, switch 5 will be identified as node B. At the decision diamond 718, the average current at switch 4 will be confirmed as higher than the average current at switch 5, so at the box 720 switch 4 (node A) will be designated as the parent of switch 5 (node B). Then looping back to the decision diamond 714, another node B will be found (switch 7), and switch 4 will be confirmed as also being the parent of switch 7—because switch 7 has a higher correlation coefficient with switch 4 than with any undiscovered node, and switch 4 has a higher average current than switch 7. This logic is discussed below relative to switches 1, 2 and 8 on FIG. 8.

In the next two passes through the process, switches 3 and 2 will be identified as having sequentially lower voltage variances, and will be found to have a high voltage correlation coefficient with the previously discovered node and a higher average current, and therefore switch 3 will be confirmed as the parent of switch 4, and switch 2 will be confirmed as the parent of switch 3. At this point, switches 2-7 have been discovered and the topology to the right of switch 2 has been properly determined. The only discovered parentless node is switch 2, and only switches 1 and 8 are undiscovered.

In the next pass through the process, switch 8 will be identified at the box 710 as having the next highest voltage variance. It will be recalled from FIG. 6 that the topology determination process based only on voltage variance produced an inaccurate result, placing switch 8 as the parent of switch 2. However, using the method of the flowchart 700, this error will not happen. Even if switch 8 has a high correlation coefficient with switch 2, the average current calculation must still be performed.

FIG. 8 shows the two possible outcomes for the discovery of switch 8. At reference 810, if switch 8 has a lower average current than switch 2, switch 8 becomes a leaf node, not the parent of switch 2. This is the actual outcome, because switch 8 handles very low current, while switch 2 handles the current for the entire upper branch of the feeder 200. The flowchart 700 resolves this correctly at the decision diamond 718, where switch 8 (node A) does not have a higher current than switch 2 (node B), and therefore switch 8 remains a leaf node (from the box 712) and is added to the set of discovered parentless nodes at the box 716.

The decision diamond 718 of the flowchart 700 is, in the case of the feeder 200, responsible for producing a correct topology, where the voltage variance-based process produced an incorrect topology. At reference 820 of FIG. 8, it is shown what the result would be if switch 8 did have a higher average current than switch 2, which is the same result as was reached earlier on FIG. 6 when no average current calculation was performed.

The topology discovery process on the feeder 200 will continue with the discovery of switch 1, which is the last remaining undiscovered node. Switch 1 will first be confirmed as the parent of switch 2 due to their high correlation, then the process will loop from the box 722 back to the decision diamond 714 where switch 8 will remain as parentless. The average current in switch 1 will be confirmed as higher than that in switch 8, and switch 1 will be confirmed as the parent of switch 8. At this point, the entire topology of the feeder 200 is correctly determined, switch 1 is parentless, and no undiscovered nodes remain. The recursive calculation process then ends, because there are no remaining undiscovered nodes, and also because the connection of the switch 1 to the source 210 may be known in the GIS database, meaning that the switch 1 is not actually parentless.

A key characteristic of the disclosed topology detection method is that it can be performed automatically whenever needed. Therefore, if a fault occurs and the network reconfigures in response to the fault, new topologies can automatically be determined. For example, if a fault occurs between switches 3 and 4 in the feeder 200, switches 3 and 4 will open to isolate the fault, and an open tie switch downstream of switch 6 or 7 would close to restore power to the customers downstream of switch 4. The disclosed method could then be used to determine the topology of the network connected to the source 210 (including switches 1, 2 and 8), and also determine the topology of the network (including switches 5, 6 and 7) connected to an adjacent feeder with its own source.

The topology detection method described above does not require the voltage and current measurements to be synchronized (such as with synchrophasors). However, synchrophasors will improve the performance of the method since the calculated correlations will be more accurate. The method may not work as well if dynamic voltage regulators are present in the circuit.

The automatic determination of topology changes is important to utilities for a variety of reasons—including understanding the impact of a fault on customers, the amount of load being supported by a source, and the amount of load which can be expected when locked-out switches are reclosed. One immediate application of the method is to verify GIS information as well as provide automatic input of grid topologies to a GIS. With this information, the real-time power flow in an electrical distribution system can be determined. The latter can then be used in a real-time control/optimization system for the electric grid to maximum efficiencies and reduce losses of a system, as well as coordinating distributed electric generation.

As will be well understood by those skilled in the art, the several and various steps and processes discussed herein to describe the disclosed methods may be referring to operations performed by a computer, a processor or other electronic calculating device that manipulate and/or transform data using electrical phenomenon. In particular, this refers to the computer 250 used for storing the voltage and current measurement data from the switches and calculating the feeder topology based on the measurement data. The switches 1-8 also preferably include processors communicating with their sensors and communication modules. Those processors and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media. Further, the computer 250 which performs the calculations described above is understood to be in communication with the switches 1-8 so that the computer 250 can receive the measurement data from sensors, and the computer 250 is also understood to be in communication with, co-located with, or able to send its output to a grid operations control center.

The disclosed methods for topology detection provide a means for determining the dynamic topology of a feeder while accurately reflecting real-world conditions such as branches, widely varying loads and distributed generation. With the topology this method generates, more informed decisions can be made about actual current flow and expected load increases upon service restoration after a fault, allowing for more efficient operation of the distribution grid in the presence of automated switch operations.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for determining a topology of a distribution grid feeder, said method comprising:
providing voltage data and current data, measured at a plurality of nodes in the feeder at a plurality of sample times, to a computer having a processor and memory;
calculating, using the computer, a voltage variance for each of the nodes and a correlation coefficient for pairs of child nodes and parent nodes of the plurality of nodes based on the voltage data for the plurality of sample times;
assigning all nodes to a set of undiscovered nodes and creating an empty set of discovered parentless nodes;
identifying a first node as a node from the set of undiscovered nodes with a highest voltage variance;
designating the first node as a leaf node;
determining if a second node exists in the set of discovered parentless nodes, where the second node has a highest correlation coefficient with the first node and the second node has a lower average current than the first node;
when the second node exists, designating the first node as a parent of the second node, removing the second node from the set of discovered parentless nodes and returning to determining if a second node exists; and
when the second node does not exist, removing the first node from the set of undiscovered nodes, adding the first node to the set of discovered parentless nodes and returning to identifying a first node.

2. The method according to claim 1 wherein each of the nodes is a switch configured for fault location, isolation and service restoration (FLISR).

3. The method according to claim 2 wherein each of the switches includes current and voltage sensors, a processor with memory in communication with the sensors, a communication module configured to communicate with the computer, and an actuator configured to open or close the switch upon receiving a command from the processor.

4. The method according to claim 1 wherein the feeder is a three phase network and the voltage and current data are measured on any one of the phases.

5. The method according to claim 1 wherein the feeder includes a source connected to one of the nodes and one or more open tie switches downstream of a different ones of the nodes, where each of the open tie switches separate the feeder from an adjacent feeder.

6. The method according to claim 5 wherein the source is a voltage-reducing substation connected to a power transmission grid.

7. The method according to claim 1 wherein the source is connected to a remaining discovered parentless node when the topology is finally determined.

8. The method according to claim 1 wherein the variance is calculated as a square of a standard deviation of the voltage data for each of the nodes.

9. The method according to claim 1 wherein the correlation coefficient is calculated as a covariance of the voltage data for each pair of the nodes divided by a product of standard deviations of the voltage data for both nodes in the pair.

10. The method according to claim 1 further comprising using the topology of the feeder for grid operational control.

11. The method according to claim 1 further comprising re-determining the topology of the feeder after a fault location, isolation and service restoration (FLISR) event.

12. An electrical network system with self-topology determination capability, said system comprising:
a plurality of nodes in the network system, each of the nodes measuring voltage data and current data at a plurality of sample times; and
a computer having a processor and memory, said computer being in communication with the plurality of nodes and receiving the voltage data and the current data, where the computer is configured with an algorithm performing steps of;
calculating a voltage variance for each of the nodes and a correlation coefficient for pairs of child nodes and parent nodes of the plurality of nodes based on the voltage data for the plurality of sample times,
assigning all nodes to a set of undiscovered nodes and creating an empty set of discovered parentless nodes,
identifying a first node as a node from the set of undiscovered nodes with a highest voltage variance,
designating the first node as a leaf node,
determining if a second node exists in the set of discovered parentless nodes, where the second node has a highest correlation coefficient with the first node and the second node has a lower average current than the first node,
when the second node exists, designating the first node as a parent of the second node, removing the second node from the set of discovered parentless nodes and returning to determining if a second node exists, and
when the second node does not exist, removing the first node from the set of undiscovered nodes, adding the first node to the set of discovered parentless nodes and returning to identifying a first node.

13. The system according to claim 12 wherein each of the nodes is a switch configured for fault location, isolation and service restoration (FLISR), and where each of the switches includes current and voltage sensors, a processor with memory in communication with the sensors, a communication module configured to communicate with the computer, and an actuator configured to open or close the switch upon receiving a command from the processor.

14. The system according to claim 12 wherein the network system is a three phase distribution feeder and the voltage and current data are measured on any one of the phases.

15. The system according to claim 14 wherein the feeder includes a source connected to one of the nodes and one or more open tie switches downstream of a different ones of the nodes, where each of the open tie switches separate the feeder from an adjacent feeder.

16. The system according to claim 12 wherein the variance is calculated as a square of a standard deviation of the voltage data for each of the nodes.

17. The system according to claim 12 wherein the correlation coefficient is calculated as a covariance of the voltage data for each pair of the nodes divided by a product of standard deviations of the voltage data for both nodes in the pair.

18. A computer program for determining a topology of a distribution grid feeder, said computer program comprising instructions for causing a computer to perform steps including:
receiving and storing voltage data and current data measured at a plurality of nodes in the feeder at a plurality of sample times;
calculating a voltage variance for each of the nodes and a correlation coefficient for pairs of child nodes and parent nodes of the plurality of nodes based on the voltage data for the plurality of sample times;
assigning all nodes to a set of undiscovered nodes and creating an empty set of discovered parentless nodes;
identifying a first node as a node from the set of undiscovered nodes with a highest voltage variance;
designating the first node as a leaf node;
determining if a second node exists in the set of discovered parentless nodes, where the second node has a highest correlation coefficient with the first node and the second node has a lower average current than the first node;
when the second node exists, designating the first node as a parent of the second node, removing the second node from the set of discovered parentless nodes and returning to determining if a second node exists; and
when the second node does not exist, removing the first node from the set of undiscovered nodes, adding the first node to the set of discovered parentless nodes and returning to identifying a first node.

19. The computer program according to claim 18 wherein each of the nodes is a switch configured for fault location, isolation and service restoration (FLISR), and where each of the switches includes current and voltage sensors, a processor with memory in communication with the sensors, a communication module configured to communicate with the computer, and an actuator configured to open or close the switch upon receiving a command from the processor.

20. The computer program according to claim 18 wherein the feeder is a three phase network and the voltage and current data are measured on any one of the phases, and where the feeder includes a power source connected to one of the nodes and one or more open tie switches downstream of a different ones of the nodes, where each of the open tie switches separate the feeder from an adjacent feeder.

* * * * *